United States Patent
Jacobson et al.

(10) Patent No.: US 6,512,354 B2
(45) Date of Patent: *Jan. 28, 2003

(54) METHOD AND APPARATUS FOR SENSING THE STATE OF AN ELECTROPHORETIC DISPLAY

(75) Inventors: Joseph M. Jacobson, Newton Centre, MA (US); Paul Drzaic, Lexington, MA (US)

(73) Assignee: E Ink Corporation, Cambridge, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/349,808

(22) Filed: Jul. 8, 1999

(65) Prior Publication Data

US 2002/0053900 A1 May 9, 2002

Related U.S. Application Data

(60) Provisional application No. 60/092,046, filed on Jul. 8, 1998.

(51) Int. Cl.[7] .......................... G01N 27/00; G01R 31/00
(52) U.S. Cl. ........................................ 324/71.1; 324/96
(58) Field of Search .................. 324/71.1, 96; 359/296, 359/290; 204/606, 450

(56) References Cited

U.S. PATENT DOCUMENTS

| | | | | |
|---|---|---|---|---|
| 3,585,381 A | * | 6/1971 | Hodson | 349/21 |
| 3,756,693 A | * | 9/1973 | Ota | 204/643 |
| 3,972,040 A |   | 7/1976 | Hilsum et al. | 340/324 M |
| 4,218,302 A | * | 8/1980 | Dalisa et al. | 359/296 |
| 4,789,858 A |   | 12/1988 | Fergason et al. | 340/784 |
| 5,174,882 A | * | 12/1992 | DiSanto et al. | 204/600 |
| 5,194,852 A |   | 3/1993 | More et al. | 340/712 |
| 5,627,561 A | * | 5/1997 | Laspina et al. | 359/296 |
| 5,930,026 A | * | 7/1999 | Jacobson et al. | 359/296 |
| 5,961,804 A | * | 10/1999 | Jacobson et al. | 204/606 |
| 6,017,584 A | * | 1/2000 | Albert et al. | 427/213.3 |
| 6,045,955 A |   | 4/2000 | Vincent | 359/296 |
| 6,051,957 A | * | 4/2000 | Klein | 324/427 |
| 6,067,185 A | * | 5/2000 | Albert et al. | 204/606 |
| 6,118,426 A | * | 9/2000 | Albert et al. | 324/96 |
| 6,120,588 A | * | 9/2000 | Jacobson | 106/31.16 |
| 6,120,839 A | * | 9/2000 | Comiskey et al. | 427/213.3 |
| 6,262,706 B1 | * | 7/2001 | Albert et al. | 349/86 |
| 6,262,833 B1 | * | 7/2001 | Loxley et al. | 204/606 |

FOREIGN PATENT DOCUMENTS

| | | | | |
|---|---|---|---|---|
| JP | 09016116 | * | 1/1997 | G09G/3/16 |
| JP | 09185087 | * | 7/1997 | G09G/3/16 |

OTHER PUBLICATIONS

CA XP–0002102514 7.5/4:05P.M.: A Stylus Writable Electrophoretic Display Device, Anne Chiang, Don Curry and Mark Zarzycki, Xerox Research Center, Palo Alto, CA, SID 79 Digest, pp. 44 and 45.

* cited by examiner

*Primary Examiner*—Michael Sherry
*Assistant Examiner*—Jermele Hollington
(74) *Attorney, Agent, or Firm*—Testa, Hurwitz & Thibeault, LLP

(57) ABSTRACT

A method for sensing the state of an electrophoretic display includes the steps of applying an electrical signal to a display element, measuring an electrical response for the display element, and deducing the state of the display element from the measured electrical response.

29 Claims, 3 Drawing Sheets

METHOD AND APPARATUS FOR SENSING THE STATE OF AN ELECTROPHORETIC DISPLAY

CROSS-REFERENCE TO RELATED APPLICATIONS

This application claims priority to U.S. Ser. No. 60/092,046 filed Jul. 8, 1998, the contents of which are incorporated herein by reference.

FIELD OF THE INVENTION

The present invention relates to electronic displays and, in particular, to methods and apparatus for sensing the state of electrophoretic displays.

BACKGROUND OF THE INVENTION

Electrophoretic display media, generally characterized by the movement of particles through an applied electric field, are highly reflective, can be made bistable, can be scaled to a large area, and consume very little power. Encapsulated electrophoretic displays also enable the display to be printed. These properties allow encapsulated electrophoretic display media to be used in many applications for which traditional electronic displays are not suitable, such as flexible displays.

One particular application for displaying screens are writing tablets, which allow an external device to "write" on the tablets. In many cases, it is desirable to sense the state of the display in order to digitize the written input.

SUMMARY OF THE INVENTION

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the term bistable will be used to indicate a display in which any optical state remains fixed once the addressing voltage is removed. The definition of a bistable state depends on the application for the display. A slowly-decaying optical state can be effectively bistable if the optical state is substantially unchanged over the required viewing time. For example, in a display which is updated every few minutes, a display image which is stable for hours or days is effectively bistable for that application. In this invention, the term bistable also indicates a display with an optical state sufficiently long-lived as to be effectively bistable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable. Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

The primary optical effect in a microencapsulated electrophoretic display device is the controlled positioning of one or more types of colloidal particles within a microcapsule. In one embodiment, colloidal particles are suspended in a colored fluid within the microcapsule. Application of an electrical signal will drive the particles to one side of the microcapsule or the other. If the colloidal particles are near the side of the microcapsule nearer the viewer, the viewer will see the color of the colloid. If the colloidal particles are nearer the opposite side of the microcapsule from the viewer, the viewer will see the colored fluid. The contrast between the colors of the fluid and the colloid, based on the colloid position, provides the means for a display device.

The position of the colloid can be controlled by application of electrical signals to electrodes built into the display. Additionally, it is possible to control the position of the colloid using an externally provided voltage signal (electrostatic writing). The display can be devised to work primarily by application of a field to electrodes, by electrostatic writing, or with both.

The present invention provides novel methods and apparatus for sensing the position of the colloid, that is, for sensing the state of electrophoretic displays electrically.

In one aspect, the present invention relates to a method for measuring the state of an electrophoretic display element. An electrophoretic display element is provided that includes a capsule containing a plurality of particles dispersed in a suspension fluid. Two electrodes are adjacent the capsule. An electrical signal is applied to the electrodes and an electrical characteristic of the display element is measured. The state of the display element may be determined from the measured electrical characteristic.

In another aspect, the present invention relates to an apparatus for determining the state of an electrophoretic display. A signal generator applies an electrical signal to two electrodes of a display element. A detection circuit measures an electrical response of the display element. A discriminator circuit determines the state of the display element based on the electrical response.

In still another aspect, the present invention relates to a an electrophoretic display comprising a plurality of electrophoretic display elements. Each electrophoretic display element has a capsule containing a plurality of particles dispersed in a suspension fluid and two electrodes adjacent the capsule. A signal generator is in electrical communication with the electrodes, and a detection circuit measures an electrical response of the display element to an applied signal. A discriminator circuit determines the state of the display element based on the electrical response detected.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

DETAILED DESCRIPTION OF THE INVENTION

Figure 1A:
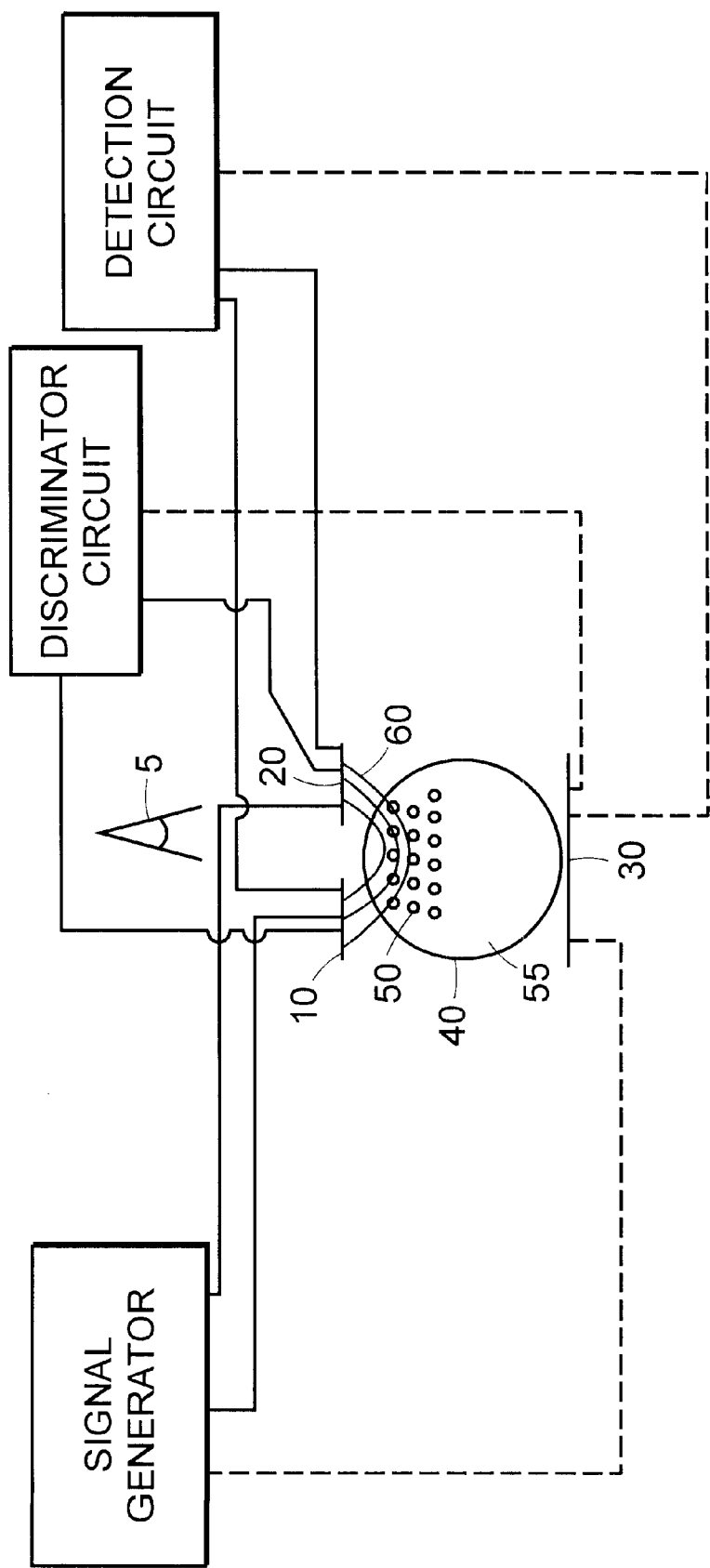
FIG. 1A is a diagrammatic side view of an electrophoretic display element with optical particles near the sensing electrodes.

An electronic ink is an optoelectronically active material which comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there are a class of materials called electroconductive powders which are also useful as coatable transparent conductors in electronic ink displays. One example is Zelec ECP electroconductive powders from DuPont Chemical Co. of Wilmington, Del.

Figure 1B:
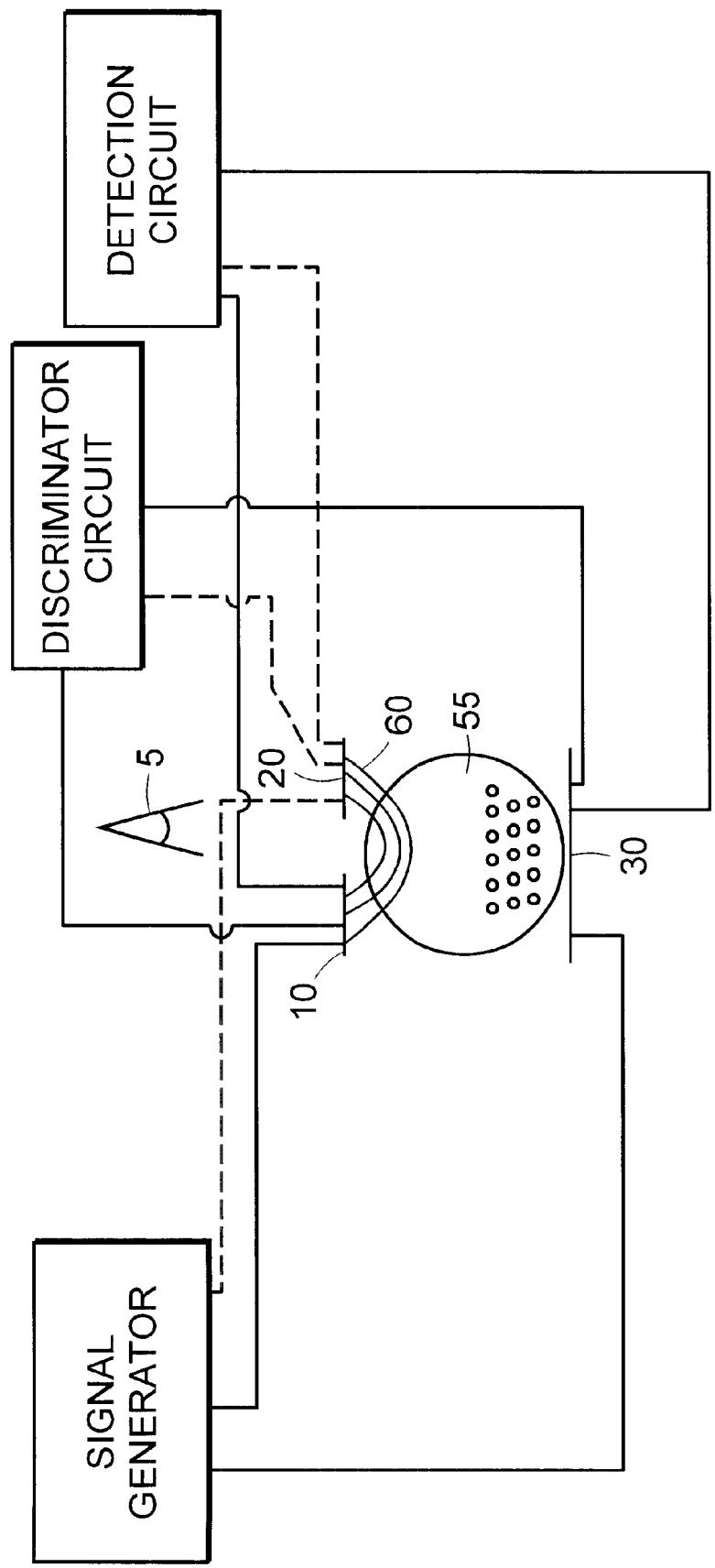
FIG. 1B is a diagrammatic side view of an electrophoretic display element with optical particles distant from the sensing electrodes.

Referring now to FIGS. 1A and 1B, a highly diagrammatic view of an electrophoretic display element is shown. An electronic ink typically comprises many such elements in a binder phase. In brief overview, capsule 40 is provided and contains electrophoretic particles 50 suspended in a dispersing fluid 55. Dispersing fluid 55 may be clear or dyed. The particles 50 typically possess optical properties of interest, such as color, luminescence, or reflectance. In some embodiments, multiple species of particles 50 may be provided in the same capsule. Electrodes 10, 20, 30 are used to translate the particles 50 within the capsule 40, thus changing the appearance of the capsule 40 to a viewer 5. Electrodes 10, 20 may be used to apply a field 60 to the capsule 40 in order to sense its state.

The position of the particles 50 within the capsule 40 may be electrically determined by applying an electrical signal to electrodes 10, 20 and measuring the electrical properties of the capsule 40 in response to the applied electrical signal.

Figure 2:
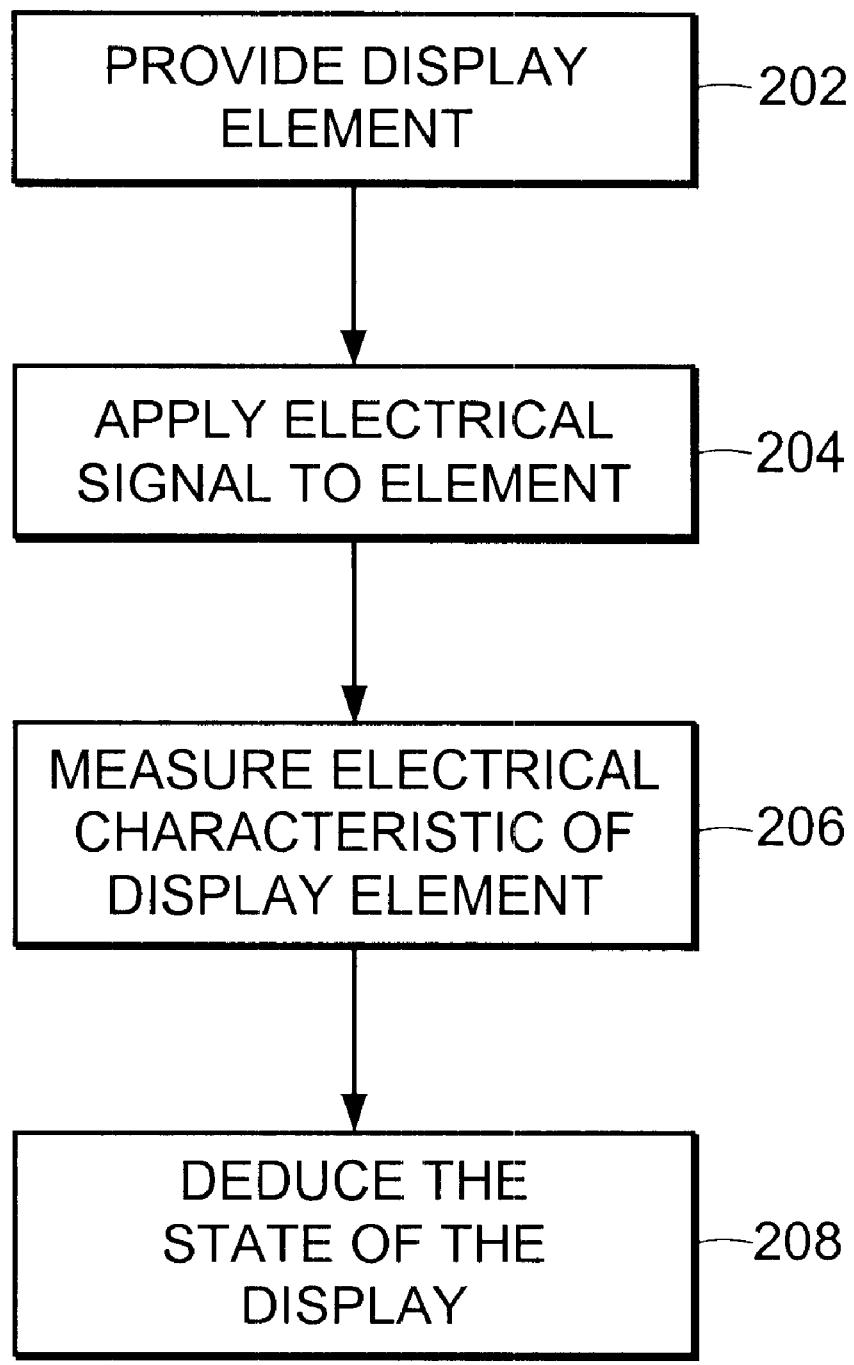
FIG. 2 is a flow chart showing the steps to be taken to sense the state of an electrophoretic display element.

In greater detail, the steps to be taken in sensing the state of an electrophoretic display are shown in FIG. 2. A display element to be measured is provided (step 202). In some embodiments, the display element is already attached to measurement device, i.e., the display includes circuitry for sensing the state of individual display elements. In other embodiments, the state of a display is measured by a separate device or devices.

An electrical signal is applied to the provided display element (step 204). Typically this is done via electrodes 10, 20, 30 adjacent the element. These can be the same electrodes used to translate the electrophoretic particles within the capsule or they can be a separate set of electrodes adjacent the capsule. The electrical signal applied to the capsule may be either an alternating-current (AC) field, a direct-current (DC) field, or some combination of the two.

Whether the signal applied to the capsule is AC, DC, or hybrid AC/DC, the signal is typically selected to minimize disturbance of the particles within the capsule. For example, an AC signal may be selected having a frequency less than 100 KHz, preferably less than 70 KHz, most preferably less than 10 KHz. In certain preferred embodiments, the selected AC signal has a frequency greater than 1 Hz. Further, voltages of such signals are selected to be less than 1 volt, preferably less than 500 millivolts, and most preferably less than 100 millivolts. In some preferred embodiments, the applied signal has an amplitude greater than 1 millivolt.

An internal or external signal source may be used to generate the electrical signal. For example, a preselected signal can be stored digitally in ROM or PROM that is electrically coupled to a digital-to-analog convertor and a driver that drives the signal to the electrodes. Alternatively, the display may be provided with an input jack, such as a BNA or similar jack, that allows a signal to be driven to the electrodes from an external signal generator.

If the electrical characteristic of particles 50 and dispersing fluid 55 differ, then the applied electrical signal will evoke a different electrical response from the display element depending on whether the particles 50 intersect the field 60 of the electrical signal applied to the electrodes or not.

The electrical response of the display element is measured (step 206). The electrical response measured can be capacitave, resistive, or some combination of two such as an RC time constant. The measurement circuit used can be a voltmeter, ammeter, ohmmeter, capacitance bridge, or some other circuit capable of measuring the desired electrical characteristic, such as a circuit capable of measuring frequency, time constant, or charge.

The state of the display element is deduced from the measured electrical response (step 208). For example, if the particles 50 have a much higher impedance than the dispersing fluid 55, then a voltage applied to the capsule 40 will be more attenuated if the particles 50 are nearer the electrodes than if they are not. In its simplest form, the circuit which performs this function (the "discriminator circuit") is a comparator. A measured electrical characteristic is compared to a predetermined threshold to determine if the particles 50 are near the electrodes or not. In another embodiment, AC current is passed through the display element at a particular frequency to determine a frequency response for the element.

The discriminator circuit may be analog or digital. In one embodiment, the discriminator circuit includes a processor that analyzes the measured electrical response of the display element. In a further embodiment, both the discriminator circuit and the signal generator are controlled by a processor.

EXAMPLE 1

A microencapsulated electrophoretic display comprising rutile titania dispersed in a low dielectric constant hydrocarbon fluid was provided. Two electrodes were positioned adjacent each other on the same substrate, adjacent also to a microcapsule, and on the back side of the display from the viewer. An AC electrical signal was placed across the electrodes, and the current passed between the electrodes measured. The frequency of the AC signal was set so that the capacitive characteristics of the microcapsules were measured. Typically, electrical frequencies in the range of 10 Hz to 10 KHz are useful in this regard. The dielectric constant near the electrodes depended on whether the colloid was on the same side of the microcapsule as the electrodes, or on the opposite sides. It is advantageous to have the spacing of the electrodes small compared to the microcapsule diameter. A high dielectric constant indicated that the colloidal particles were near the electrodes, and the display is dark. A low dielectric constant indicated that the colloidal particles were away from the electrodes and at the front of the microcapsule, and that the display is light. Low amplitude voltages were used to make the measurement. Preferably, the applied voltage is less than the operating voltage of the display. Typically, AC voltages in the range of 1 mV to 1 V, and particularly in the range of 10 mV to 100 mV, are useful.

EXAMPLE 2

A microencapsulated electrophoretic display was constructed with sensing electrodes on opposing sides of the display. These electrodes could be separate structures, or could be the same electrodes used to address the display. The colloidal dispersion was constructed so that the colloid contains a net negative charge. A negative charge is placed on the front electrode, sufficient to address some or all of the pixel. If the colloid is near the front of the microcapsule, the colloid will be repelled from the front surface and attracted to the back. The movement of the colloid gives a characteristic current signal, which rises, peaks, and then diminishes as the colloid transits the cell. This peak has a characteristic time constant and amplitude, depending on the display characteristics. For example, in a display which requires 90 V to address and a cell gap of 100 microns, the colloid transits in the range of 100 ms to 2 seconds, depending on the formulation.

Alternatively, if the colloid was already near the back, then application of this voltage will cause no change in the colloid position, and the electrical signal will be indicative of only background ions transiting the cell.

In this case, the discriminator circuit looks for the presence of absence of a peak with a constant in this range. If the colloid transits the cell, then the particles were near the front. If no peak is seen, the colloid was already near the back.

Alternatively, the detection circuit can be constructed to measure the total charged or current passed by the cell. The charge or current will be higher if the colloidal particles transit the cell, and be lower if they do not transit the cell.

EXAMPLE 3

The case of example 2, except the electrodes were adjacent as single side of the display, and spaced close together relative to the microcapsule size. Application of a voltage in the range of 1 V to 100 V causes some of the colloid to move from one electrode to the other if the colloid is near the surface of microcapsule adjacent the electrodes. If the colloid is on the other side of the microcapsule, no such transit will be seen. The discriminator circuit looks for the presence or absence of a current representing the colloidal particles, and thus determine if the colloid is on the face nearer or further from the electrodes. This method has the advantage of not disturbing the relative position of the colloid in the front or back of the display.

While the examples described here are listed using encapsulated electrophoretic displays, there are other particle-based display media which should also work as well, including encapsulated suspended particles and rotating ball displays.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method for measuring the physical state of an electrophoretic display element, comprising the steps of:
    (a) providing an electrophoretic display element comprising a capsule containing a plurality of particles dispersed in a suspension fluid and having two electrodes adjacent said capsule;
    (b) applying an electrical signal to said two electrodes;
    (c) measuring an electrical characteristic of the display element, the electrical characteristic generated in response to the applied electrical signal; and
    (d) deducing the physical state of the electrophoretic display element based on the measured electrical characteristic.

2. The method of claim 1, wherein step (b) comprises applying an AC electrical signal having a frequency greater than 1 Hz to said two electrodes.

3. The method of claim 1, wherein step (b) comprises applying an AC electrical signal having a frequency greater than 1 Hz and less than 10 KHz to said two electrodes.

4. The method of claim 1, wherein step (b) comprises applying an AC electrical voltage signal having an amplitude greater than 1 millivolt rms.

5. The method of claim 1, wherein step (b) comprises applying an AC electrical voltage signal having an amplitude greater than 1 millivolt rms and less than 100 millivolts rms.

6. The method of claim 1, wherein step (b) comprises applying a DC electrical signal to said two electrodes.

7. The method of claim 6, wherein step (c) comprises measuring an electrical characteristic represented by a time constant.

8. The method of claim 6, wherein step (c) comprises measuring an electrical characteristic represented by a current.

9. The method of claim 6, wherein step (c) comprises measuring an electrical characteristic represented by an electrical charge.

10. The method of claim 6, wherein step (c) comprises measuring an electrical characteristic represented by a voltage.

11. The method of claim 1, wherein step (b) comprises applying an AC electrical signal to said two electrodes.

12. The method of claim 11, wherein step (c) comprises measuring an electrical characteristic represented by a time constant.

13. The method of claim 11, wherein step (c) comprises measuring an electrical characteristic represented by a current.

14. The method of claim 11, wherein step (c) comprises measuring an electrical characteristic represented by an electrical charge.

15. The method of claim 11, wherein step (c) comprises measuring an electrical characteristic represented by a voltage.

16. An apparatus for determining the physical state of an electrophoretic display element having two electrodes adjacent a capsule containing a plurality of particles dispersed in a suspension fluid, comprising:
    (a) a signal generator for applying an electrical signal to two electrodes of a display element;
    (b) a detection circuit for measuring an electrical response of the display element to the applied signal; and
    (c) a discriminator circuit for determining a state of the display element based on said electrical response.

17. The apparatus of claim 16 wherein said detection circuit comprises a capacitance bridge.

18. The apparatus of claim 16 wherein said detection circuit comprises a circuit capable of measuring time constants.

19. The apparatus of claim 16 wherein said detection circuit comprises a circuit capable of measuring frequency.

20. The apparatus of claim 16 wherein said detection circuit comprises a circuit capable of measuring electrical charge.

21. The apparatus of claim 16 wherein said discriminator circuit comprises a comparator.

22. The apparatus of claim 16 wherein said discriminator circuit comprises an analog to digital converter and a processor.

23. An electrophoretic display comprising a plurality of display elements and capable of determining the physical state of an individual display element, the display comprising:
    (a) an electrophoretic display element comprising a capsule containing a plurality of particles dispersed in a suspension fluid, and having two electrodes adjacent said capsule;
    (b) a signal generator for applying an electrical signal to said two electrodes;
    (c) a detection circuit for measuring an electrical response of said display element to said applied signal; and
    (d) a discriminator circuit for determining a state of said display element based on said electrical response.

24. The electrophoretic display of claim 23 wherein said detection circuit comprises a capacitance bridge.

25. The electrophoretic display of claim 23 wherein said detection circuit comprises a circuit capable of measuring time constants.

26. The electrophoretic display of claim 23 wherein said detection circuit comprises a circuit capable of measuring frequency.

27. The electrophoretic display of claim 23 wherein said detection circuit comprises a circuit capable of measuring electrical charge.

28. The electrophoretic display of claim 23 wherein said discriminator circuit comprises a comparator.

29. The electrophoretic display of claim 28 wherein said discriminator circuit comprises an analog to digital converter and a processor.

* * * * *